(12) United States Patent
Gervais

(10) Patent No.: US 11,037,056 B2
(45) Date of Patent: Jun. 15, 2021

(54) COMPUTING DEVICE AND METHOD FOR INFERRING A PREDICTED NUMBER OF DATA CHUNKS WRITABLE ON A FLASH MEMORY BEFORE WEAR OUT

(71) Applicant: DISTECH CONTROLS INC., Brossard (CA)

(72) Inventor: Francois Gervais, Lachine (CA)

(73) Assignee: DISTECH CONTROLS INC., Brossard (CA)

(*) Notice: Subject to any disclaimer, the term of this patent is extended or adjusted under 35 U.S.C. 154(b) by 835 days.

(21) Appl. No.: 15/819,818

(22) Filed: Nov. 21, 2017

(65) Prior Publication Data

US 2019/0156195 A1    May 23, 2019

(51) Int. Cl.
*G06N 3/08* (2006.01)
*G06N 7/00* (2006.01)
*G11C 16/34* (2006.01)
*G11C 16/10* (2006.01)

(52) U.S. Cl.
CPC .............. *G06N 3/08* (2013.01); *G06N 7/005* (2013.01); *G11C 16/349* (2013.01); *G11C 16/3495* (2013.01); *G11C 16/10* (2013.01)

(58) Field of Classification Search
USPC .......................................................... 706/21
See application file for complete search history.

(56) References Cited

U.S. PATENT DOCUMENTS

| | | | |
|---|---|---|---|
| 8,112,586 B1 | 2/2012 | Reiner et al. | |
| 10,282,662 B2* | 5/2019 | Schaul | G06N 3/088 |
| 10,565,149 B2* | 2/2020 | Renaud | G06F 13/42 |
| 10,598,401 B2* | 3/2020 | Gagnon | G05B 13/048 |
| 10,616,121 B2* | 4/2020 | Gervais | H04L 67/025 |
| 10,650,310 B2* | 5/2020 | Schaul | G06N 3/088 |
| 10,838,375 B2* | 11/2020 | Gervais | G06N 5/04 |
| 10,845,768 B2* | 11/2020 | Gervais | G01S 17/04 |
| 10,895,853 B2* | 1/2021 | Gervais | G06F 9/451 |
| 10,908,561 B2* | 2/2021 | Gervais | H04L 12/2829 |
| 2012/0005402 A1 | 1/2012 | Yamamoto et al. | |
| 2013/0326284 A1 | 12/2013 | Losh et al. | |
| 2014/0165674 A1 | 6/2014 | Hickman | |

(Continued)

OTHER PUBLICATIONS

Entire prosecution history of U.S. Appl. No. 15/819,606, filed Nov. 21, 2017.

*Primary Examiner* — Michael B Holmes
(74) *Attorney, Agent, or Firm* — RatnerPrestia

(57) ABSTRACT

Computing device and method for inferring a predicted number of data chunks writable on a flash memory before the flash memory wears out. The computing device stores a predictive model generated by a neural network training engine. A processing unit of the computing device executes a neural network inference engine, using the predictive model for inferring the predicted number of data chunks writable on the flash memory before the flash memory wears out based on inputs. The inputs comprise a total number of physical blocks previously erased from the flash memory, a size of the data chunk, and optionally an operating temperature of the flash memory. In a particular aspect, the flash memory is comprised in the computing device, and an action may be taken for preserving a lifespan of the flash memory based at least on the predicted number of data chunks writable on the flash memory.

17 Claims, 10 Drawing Sheets

(56) References Cited

U.S. PATENT DOCUMENTS

| | | |
|---|---|---|
| 2015/0062607 A1 | 3/2015 | Higashi |
| 2016/0034206 A1 | 2/2016 | Ryan et al. |
| 2016/0179403 A1 | 6/2016 | Kurotsuchi et al. |
| 2018/0210825 A1 | 7/2018 | Gim et al. |
| 2019/0149476 A1* | 5/2019 | Gervais .................. G06N 3/084 709/233 |
| 2020/0057814 A9* | 2/2020 | Ioannou ................ G06F 3/0608 |

* cited by examiner

COMPUTING DEVICE AND METHOD FOR INFERRING A PREDICTED NUMBER OF DATA CHUNKS WRITABLE ON A FLASH MEMORY BEFORE WEAR OUT

TECHNICAL FIELD

The present disclosure relates to the field of memory devices comprising flash memory. More specifically, the present disclosure relates to a computing device and method for inferring a predicted number of data chunks writable on a flash memory before the flash memory wears out, through the usage of a neural network.

BACKGROUND

Flash memory is a form of electrically-erasable programmable read-only memory (EEPROM) with the following characteristic: a portion of the memory is erased before data are written in the erased portion of the memory. However, a conventional EEPROM erases data on a bit-by-bit level, while a flash memory erases data on a block-by-block level. These blocks are usually referred to as physical blocks of memory, by contrast to logical blocks of memory. The size of the physical block may vary from one byte to a plurality of bytes. Thus, a physical block on a flash memory is erased before new data is written to this physical block of the flash memory. One advantage of flash memory (and more generally of EEPROM) is that it is a nonvolatile form of memory, which does not require power to preserve stored data with integrity, so that a device embedding a flash memory can be turned off without losing data.

The flash memory is worn out by erase operations performed on the physical blocks of the flash memory. The manufacturer of the flash memory generally provides a life expectancy of the flash memory expressed as a limitation on the number of erase operations which can be performed. For example, the flash memory can support 10,000 erase operations on physical blocks, or the flash memory can support an average of 350 physical blocks being erased per hour for a duration of 10 years.

It is very difficult to consistently predict a number of data chunks writable on a flash memory before the flash memory wears out, the data chunk having a given size. However, a model for predicting the number of data chunks writable on a flash memory before the flash memory wears out may be useful for taking actions to preserve the lifespan of the flash memory.

Current advances in artificial intelligence, and more specifically in neural networks, can be taken advantage of to define a model taking into consideration operating conditions of the flash memory to predict the number of data chunks writable on a flash memory before the flash memory wears out.

Therefore, there is a need for a new computing device and method for inferring a predicted number of data chunks writable on a flash memory before the flash memory wears out, through the usage of a neural network.

SUMMARY

According to a first aspect, the present disclosure provides a computing device. The computing device comprises memory for storing a predictive model generated by a neural network training engine. The computing device also comprises a processing unit for executing a neural network inference engine. The neural network inference engine uses the predictive model for inferring a predicted number of data chunks writable on a flash memory before the flash memory wears out based on inputs. The inputs comprise a total number of physical blocks previously erased from the flash memory, and a size of the data chunk. The inputs may further include a temperature at which the flash memory is operating.

According to a second aspect, the present disclosure provides a computing device. The memory comprises a memory device comprising flash memory. The flash memory comprises a plurality of physical blocks for writing data. The computing device also comprises memory for storing a predictive model generated by a neural network training engine, and a total number of physical blocks previously erased from the flash memory. The computing device further comprises a processing unit for executing a neural network inference engine. The neural network inference engine uses the predictive model for inferring a predicted number of data chunks writable on a flash memory before the flash memory wears out based on inputs. The inputs comprise the total number of physical blocks previously erased from the flash memory, and a size of the data chunk. The inputs may further include a temperature at which the flash memory is operating. The memory for storing the predictive model and the total number of physical blocks previously erased from the flash memory may consist of the flash memory.

According to a third aspect, the present disclosure provides a method for inferring a predicted number of data chunks writable on a flash memory before the flash memory wears out. The method comprises storing, by a computing device, a predictive model generated by a neural network training engine. The method comprises executing, by a processing unit of the computing device, a neural network inference engine. The neural network inference engine uses the predictive model for inferring the predicted number of data chunks writable on the flash memory before the flash memory wears out based on inputs. The inputs comprise a total number of physical blocks previously erased from the flash memory, and a size of the data chunk. The inputs may further include a temperature at which the flash memory is operating. The flash memory may be comprised in the computing device, and the method may further comprise storing by the computing device the total number of physical blocks previously erased from the flash memory.

BRIEF DESCRIPTION OF THE DRAWINGS

Embodiments of the disclosure will be described by way of example only with reference to the accompanying drawings, in which.

DETAILED DESCRIPTION

The foregoing and other features will become more apparent upon reading of the following non-restrictive description of illustrative embodiments thereof, given by way of example only with reference to the accompanying drawings. Like numerals represent like features on the various drawings.

Various aspects of the present disclosure generally address one or more of the problems related to the wear out of flash memory embedded in a memory device. The flash memory is worn out by erase operations performed on physical blocks of the flash memory. The present disclosure aims at providing a mechanism for inferring a predicted number of physical blocks erased from a flash memory, through the usage of a neural network. The present disclosure also aims at providing a mechanism for inferring a predicted number of data chunks writable on a flash memory before the flash memory wears out, through the usage of a neural network.

Figure 1:
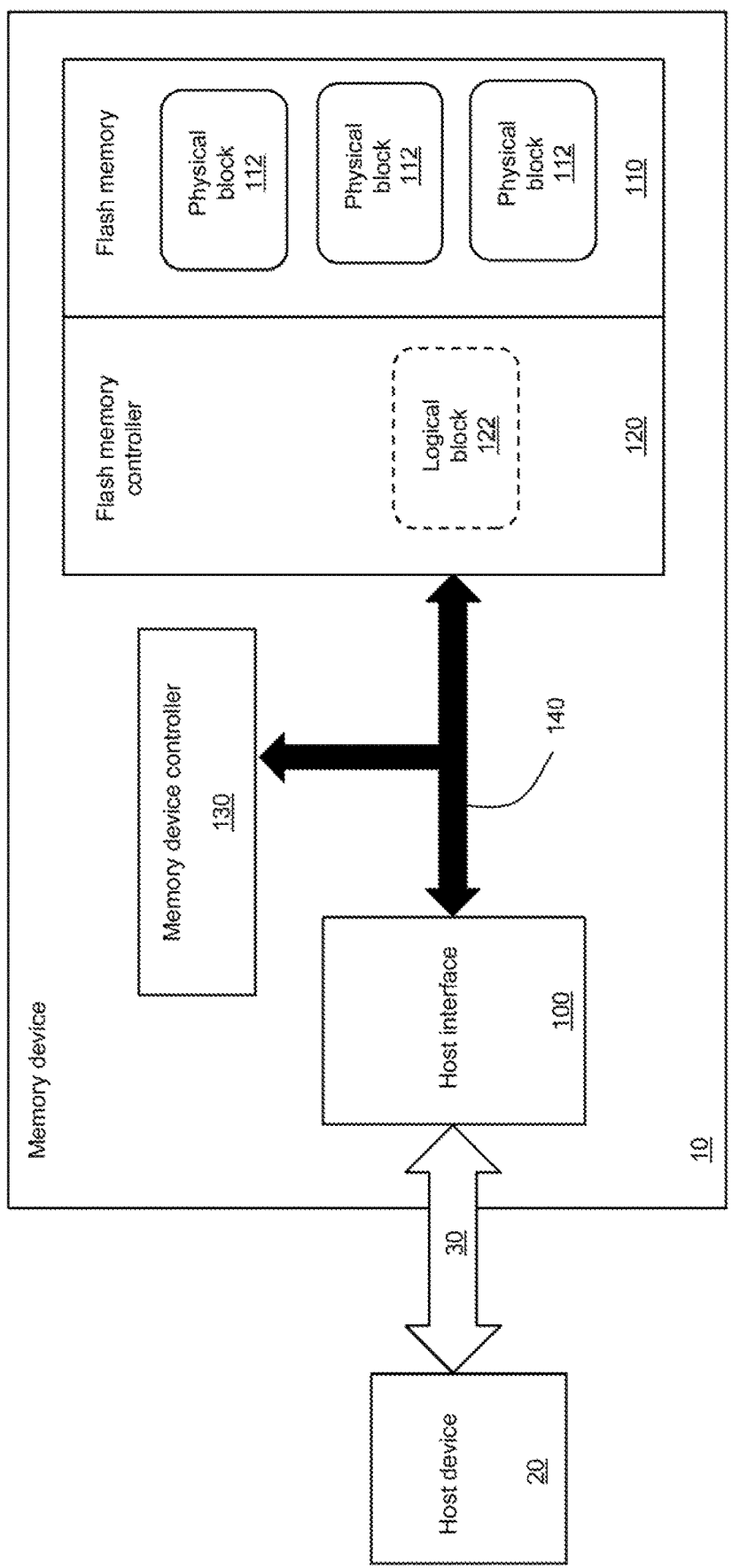
FIG. 1 is a schematic representation of a memory device comprising flash memory.
Figure 2:
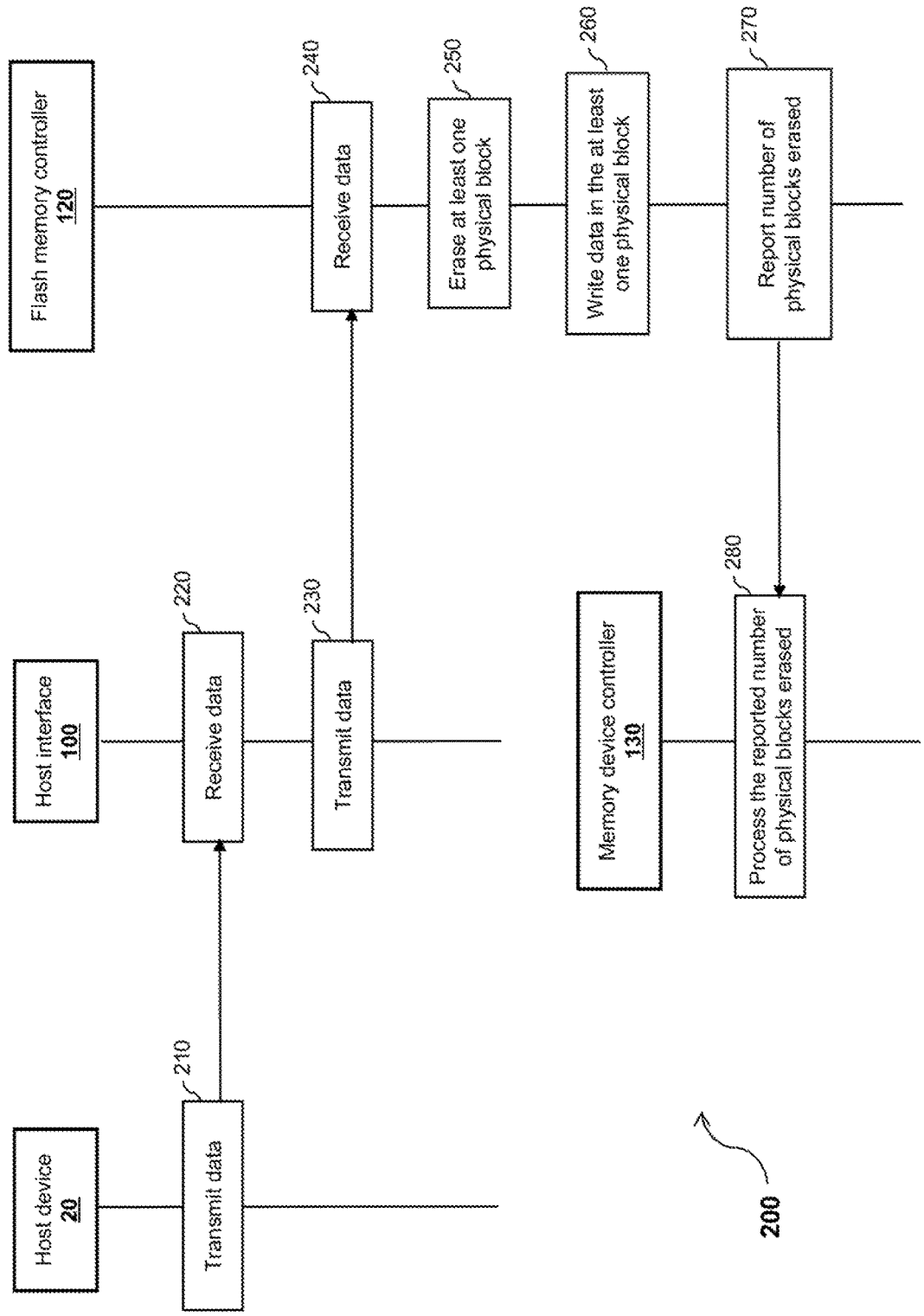
FIG. 2 represents a method for performing a write operation on the flash memory of FIG. 1.

Referring now concurrently to FIGS. 1 and 2, a memory device 10 comprising flash memory 110 (represented in FIG. 1), and a method 200 (represented in FIG. 2) for writing data on the flash memory 110 of the memory device 10, are represented.

The flash memory 110 comprises a plurality of physical blocks of memory 112. Only three physical blocks 112 have been represented in FIG. 1 for simplification purposes. The number of physical blocks 112 of the flash memory 110 depends on the capacity of the flash memory 110, which is usually expressed in gigabytes (e.g. 16, 32, 64, 128, etc.). The number of physical blocks 112 of the flash memory 110 also depends on the size of the physical block 112, which varies from one to several bytes.

The present disclosure is not limited to flash memory, but can be extended to any form of memory operating as follows: a physical block of the memory is erased before new data is written to this physical block of the memory.

The memory device 10 also comprises a flash memory controller 120 for controlling the operations of the flash memory 110, and a host interface 100 connected to a bus 30. The memory device 10 further comprises a memory device controller 130 for controlling the operations of the memory device 10. An internal bus 140 interconnects several components of the memory device 10. For example, the internal bus 140 represented in FIG. 1 interconnects the host interface 100, the memory device controller 130 and the flash memory controller 120.

An example of memory device 10 is an embedded multimedia card (eMMC), which has an architecture similar to the one represented in FIG. 1 in terms of electronic components. However, other types of memory devices 10 (embedding the flash memory 110 and the memory device controller 130 having the capability to control a write speed on the bus 30) are also supported by the present disclosure. Furthermore, the architecture of the memory device 10 may vary. For example, the memory device controller 130 is integrated with the host interface 100, the memory device controller 130 is integrated with the flash memory controller 120, the flash memory controller 120 is integrated with the host interface 100, etc.

At least one host device 20 uses the bus 30 for writing data to (and/or reading data from) the memory device 10. Examples of host devices include: a processor, a central processing unit (CPU), a graphics processing unit (GPU), a microcontroller unit (MCU), a field-programmable gate array (FPGA), etc. A single host device 20 is represented in FIG. 1 for simplification purposes. However, a plurality of host devices (e.g. a plurality of processors) may be using the bus 30 for transmitting data to and/or receiving data from the memory device 10.

Examples of computing devices (not represented in the Figures) comprising the memory device 10 and at least one host device 20 include personal computers, laptops, tablets, smartphones, digital cameras, scientific instruments, medical devices, industrial appliances (e.g. environment controllers, sensors, controlled appliances), etc.

A write operation on the flash memory 110 is illustrated in FIG. 2, and comprises the following steps of the method 200.

At step 210, the host device 20 transmits data to be written on the flash memory 110 of the memory device 10 over the bus 30.

At step 220, the host interface 100 receives the data transmitted by the host device 20 via the bus 30.

At step 230, the host interface 100 transmits the data received from the host device 20 via the bus 30 to the flash memory controller 120 over the internal bus 140.

In an alternative configuration not represented in FIG. 2, the host interface 100 transmits the data received from the host device 20 via the bus 30 to the memory device controller 130 over the internal bus 140. The memory device controller 130 performs some processing prior to effectively allowing the write operation. For instance, the memory device controller 130 determines if a write operation can be effectively performed, checks the integrity of the data, etc. Then, the memory device controller 130 transmits the data to the flash memory controller 120 over the internal bus 140.

At step 240, the flash memory controller 120 receives the data transmitted by the host interface via the internal bus 140.

At step 250, the flash memory controller 120 erases at least one physical block 112 of the flash memory 110. The number of physical blocks erased depends on the size of the physical blocks 112, and the size of the data received by the flash memory controller 120. For example, if each physical block 112 has a size of 8 bytes, and the received data have a size of 1024 bytes, then 128 physical blocks 112 are erased. The flash memory controller 120 maintains a mapping of the physical blocks 112 currently in use and available for reading by host device(s) 20. The physical blocks 112 erased at step 250 are not currently in use.

At step 260, the flash memory controller 120 writes the data received at step 240 in the at least one physical block 112 erased at step 250.

Optionally, the flash memory controller 120 comprises one or more logical blocks 122. Only one logical block 122 is represented in FIG. 1 for simplification purposes. The one or more logical blocks 122 correspond to a dedicated memory (not represented in FIG. 1) of the flash memory controller 120, where data received at step 240 are temporarily stored, before steps 250 (erase) and 260 (write) are executed. The usage of one or more logical blocks 122 is well known in the art of flash memory management, and allows an optimization of the operations of the flash memory controller 120. For example, step 240 is repeated several times, and the data received at each occurrence of step 240 are aggregated and stored in the one or more logical blocks 122. Then, steps 250 (erase) and 260 (write) are executed only once for the aggregated data stored in the one or more logical blocks 122.

At step 270, the flash memory controller 120 reports the number of physical blocks 112 erased at step 250 to the memory device controller 130. Alternatively, the flash memory controller 120 does not perform step 270 each time step 250 is performed, but reports an aggregated number of physical blocks 112 erased corresponding to several executions of step 250. Each time a physical block among the plurality of physical blocks 112 of the flash memory 110 is erased, the erase operation is reported to the memory device controller 130 at step 270.

For example, during a first instance of step 250, physical blocks B1, B2 and B3 among the plurality of physical blocks 112 of the flash memory 110 are erased. A number of 3 blocks erased is reported at step 270. During a second instance of step 250, physical blocks B2 and B5 among the plurality of physical blocks 112 of the flash memory 110 are erased. A number of 2 blocks erased is reported at step 270. During a third instance of step 250, physical blocks B1, B3, B4 and B6 among the plurality of physical blocks 112 of the flash memory 110 are erased. A number of 4 blocks erased is reported at step 270.

At step 280, the memory device controller 130 processes the reported (by the flash memory controller 120 at step 270) number of physical blocks 112 erased. For example, the memory device controller 130 reports the number of physical blocks 112 erased to the host device via the host interface 100 and the bus 30, as will be illustrated later in the description.

The memory device controller 130, the flash memory controller 120 and optionally the host interface 100 are electronic devices comprising a processing unit capable of executing instructions of a software program. The memory device controller 130, the flash memory 120 (and optionally the host interface 100) also include internal memory for storing instructions of the software programs executed by these electronic devices, data received from other entities of the memory device 10 via the internal bus 140, data generated by the software programs, etc. Alternatively, a standalone memory (e.g. the flash memory 110, or another dedicated memory not represented in FIG. 1) is included in the memory device 10 for storing the software programs executed by at least one of the memory device controller 130 and the flash memory controller 120, data received and generated by at least one of the memory device controller 130 and the flash memory controller 120. For instance, the memory device controller 130 and the flash memory controller 120 consist of microcontroller units (MCU), which are well known in the art of electronics.

The memory device controller 130 executes instructions of a software program implementing the steps of the method 200 executed by the memory device controller 130. The flash memory controller 120 executes instructions of a software program implementing the steps of the method 200 executed by the flash memory controller 120.

An internal memory of the memory device controller 130 or the flash memory controller 120, a standalone memory of the memory device 10, are examples of a non-transitory computer program product adapted for storing instructions of the software programs executed by the memory device controller 130 or the flash memory controller 120.

Alternatively, at least some of the memory device controller 130, the flash memory controller 120 and the host interface 100 are pure hardware components, such as a field-programmable gate array (FPGA). For example, the host interface 100 performs simple operations and can be more cost-effectively implemented by a FPGA.

Figure 3:
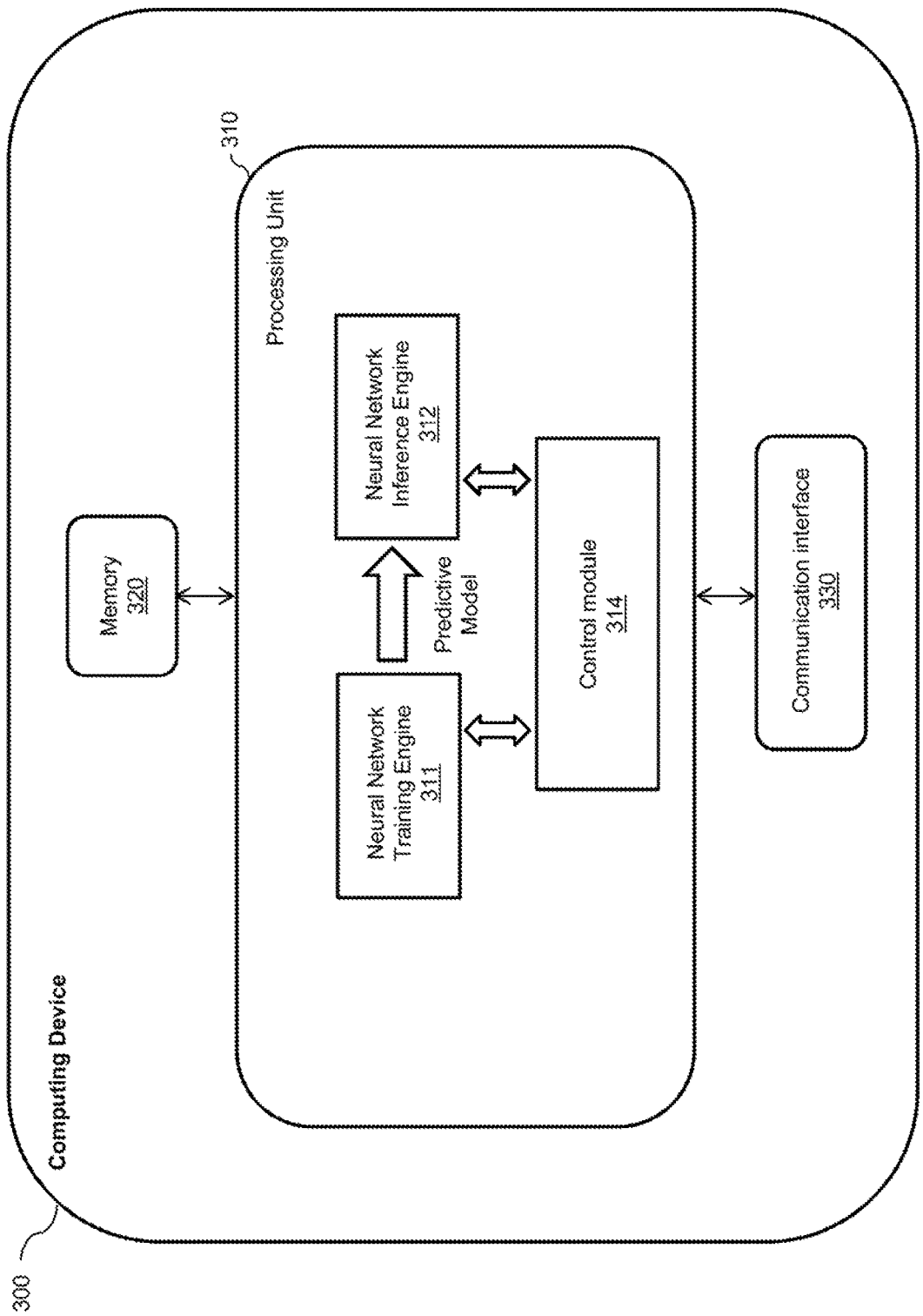
FIG. 3 represents a computing device executing a neural network inference engine.
Figure 4:
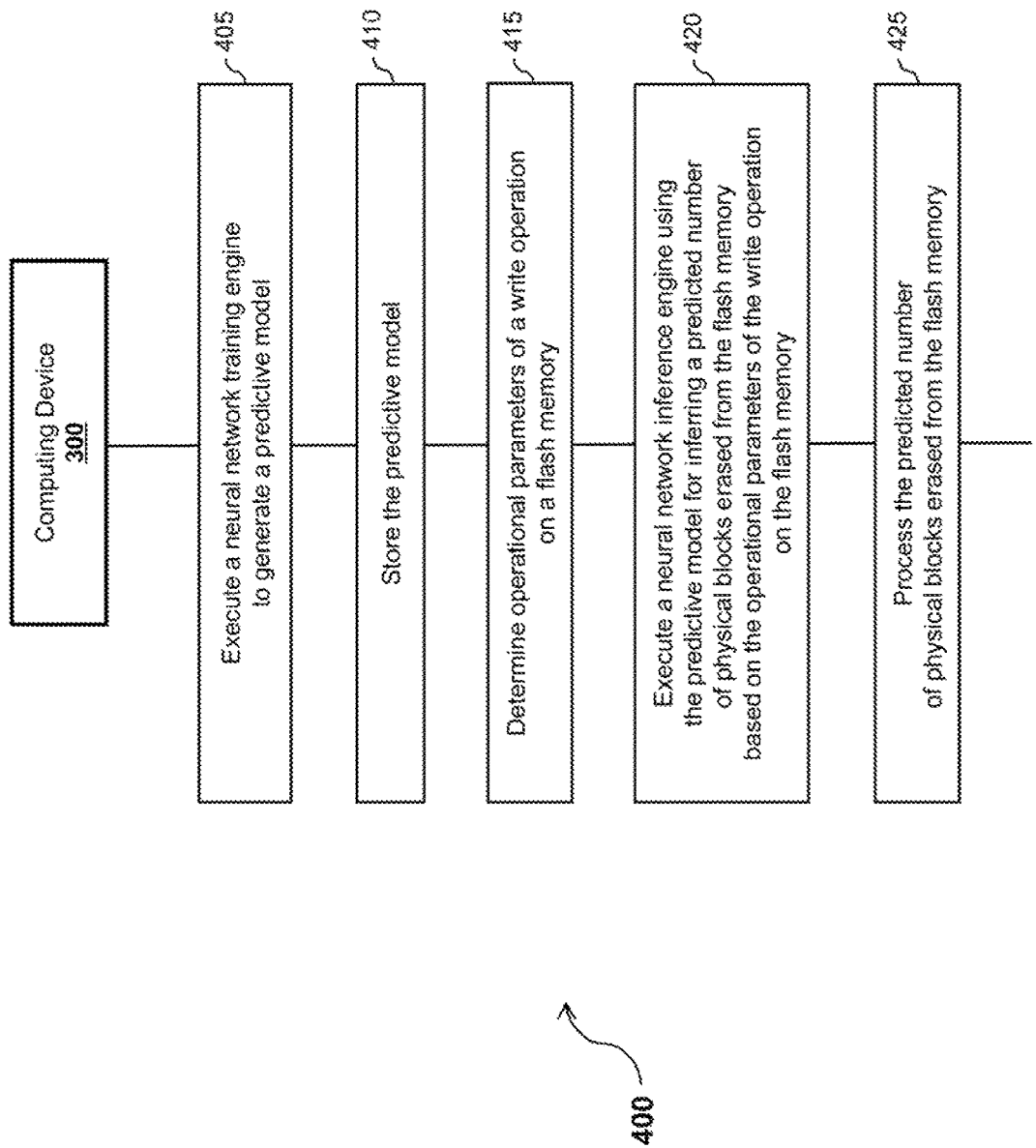
FIG. 4 represents a method executed by the computing device of FIG. 3 for inferring a predicted number of physical blocks erased from a flash memory.

Referring now concurrently to FIGS. 3 and 4, a computing device 300 (represented in FIG. 3) and a method 400 (represented in FIG. 4) for inferring a predicted number of physical blocks erased from a flash memory through the usage of a neural network are illustrated. The flash memory in question corresponds the flash memory (110) of the memory device (10) represented in FIG. 1.

The computing device 300 comprises a processing unit 310, memory 320, and a communication interface 330. The computing device 300 may comprise additional components (not represented in FIG. 3 for simplification purposes), such as a user interface, a display, another communication interface, etc.

The processing unit 310 comprises one or more processors (not represented in FIG. 3) capable of executing instructions of a computer program. Each processor may further comprise one or several cores.

The memory 320 stores instructions of computer program(s) executed by the processing unit 310, data generated by the execution of the computer program(s), data received via the communication interface 330, etc. Only a single memory 320 is represented in FIG. 3, but the computing device 300 may comprise several types of memories, including volatile memory (such as a volatile Random Access Memory (RAM)) and non-volatile memory (such as a hard drive).

The steps of the method 400 are implemented by the computing device 300, to infer a predicted number of physical blocks erased from a flash memory through the usage of a neural network.

A dedicated computer program has instructions for implementing the steps of the method 400. The instructions are comprised in a non-transitory computer program product (e.g. the memory 320) of the computing device 300. The instructions provide for inferring a predicted number of physical blocks erased from a flash memory through the usage of a neural network, when executed by the processing unit 310 of the computing device 300. The instructions are deliverable to the computing device 300 via an electronically-readable media such as a storage media (e.g. CD-ROM, USB key, etc.), or via communication links (e.g. via a communication network (not represented in FIG. 3 for simplification purposes) through the communication interface 330).

The instructions comprised in the dedicated computer program product, and executed by the processing unit 310, implement a neural network training engine 311, a neural network inference engine 312, and a control module 314.

The execution of the neural network training engine 311 generates a predictive model, which is stored in the memory 320 and used by the neural network inference engine 312.

The control module 314 controls the operations of the neural network training engine 311 and the neural network inference engine 312.

The method 400 comprises the step 405 of executing the neural network training engine 311 (by the processing unit 310 of the computing device 300) to generate the predictive model. This step is performed under the control of the control module 314, which feeds a plurality of inputs and a corresponding plurality of outputs to the neural network training engine 311. This training process is well known in the art, and will be detailed later in the description. For example, the control module 314 receives the plurality of inputs and the corresponding plurality of outputs via the communication interface 330 from one or more remote computing devices (not represented in FIG. 3) in charge of collecting the plurality of inputs and the corresponding plurality of outputs. Alternatively, the control module 314 receives the plurality of inputs and the corresponding plurality of outputs via a user interface of the computing device 300 (not represented in FIG. 3) from a user in charge of collecting the plurality of inputs and the corresponding plurality of outputs.

The method 400 comprises the step 410 of storing the predictive model in the memory 320 of the computing device 300.

The method 400 comprises the step 415 of determining operational parameters of a write operation on a flash memory. This step is performed by the control module 314. In the present configuration, the flash memory is not part of the computing device 300. Another configuration where the flash memory is part of the computing device 300 will be illustrated later in the description. For example, the control module 314 receives the operational parameters of the flash memory via the communication interface 330 from one or more remote computing devices (not represented in FIG. 3) in charge of collecting the operational parameters of the flash memory. Alternatively, the control module 314 receives the operational parameters of the flash memory via a user interface of the computing device 300 (not represented in FIG. 3) from a user in charge of collecting the operational parameters of the flash memory.

The method 400 comprises the step 420 of executing the neural network inference engine 312 (by the processing unit 310). The neural network inference engine 312 uses the predictive model (stored in memory 320 at step 410) for inferring a predicted number of physical blocks erased from the flash memory based on the operational parameters of the write operation on the flash memory (determined at step 415). This step is performed under the control of the control module 314, which feeds the operational parameters of the flash memory to the neural network inference engine 312, and receives the inferred predicted number of physical blocks erased from the flash memory from the neural network inference engine 312.

The method 400 comprises the step 425 of processing the predicted number (inferred at step 420) of physical blocks erased from the flash memory. This step is performed by the control module 314, which receives the predicted number of physical blocks erased from the flash memory from the neural network inference engine 312. For example, the control module 314 displays the predicted number of physical blocks erased from the flash memory to a user on a display (not represented in FIG. 3) of the computing device 300. Alternatively, the control module 314 transmits the predicted number of physical blocks erased from the flash memory via the communication interface 330 to one or more remote computing devices (not represented in FIG. 3) in charge of processing the predicted number of physical blocks erased from the flash memory.

Once steps 405 and 410 have been performed, steps 415, 420 and 425 can be repeated a plurality of time, with different operational parameters of the write operation on the flash memory at step 415 at each repetition of steps 415, 420 and 425.

Although the neural network training engine 311 and the neural network inference engine 312 are represented as separate entities in FIG. 3, they can be implemented by a single module (e.g. a single software module) capable of performing both the training phase and the inference phase of a neural network.

Furthermore, the training phase performed at step 405 requires more processing power than the inferring phase performed at step 420. Thus, step 405 may be performed by a training server not represented in FIG. 3. The training server comprises a processing unit for executing the neural network training engine 311 which performs step 405 to generate the predictive model. The training server also comprises memory for storing the predictive model, and a communication interface for transferring the predictive model to the computing device 300. In this configuration, the processing unit 310 of the computing device 300 does not execute the neural network training engine 311. The training server needs more processing power for executing the neural network training engine 311 (which is more computational intensive) than the computing device 300 for executing the neural network inference engine 312 (which is less computational intensive).

Figure 5:
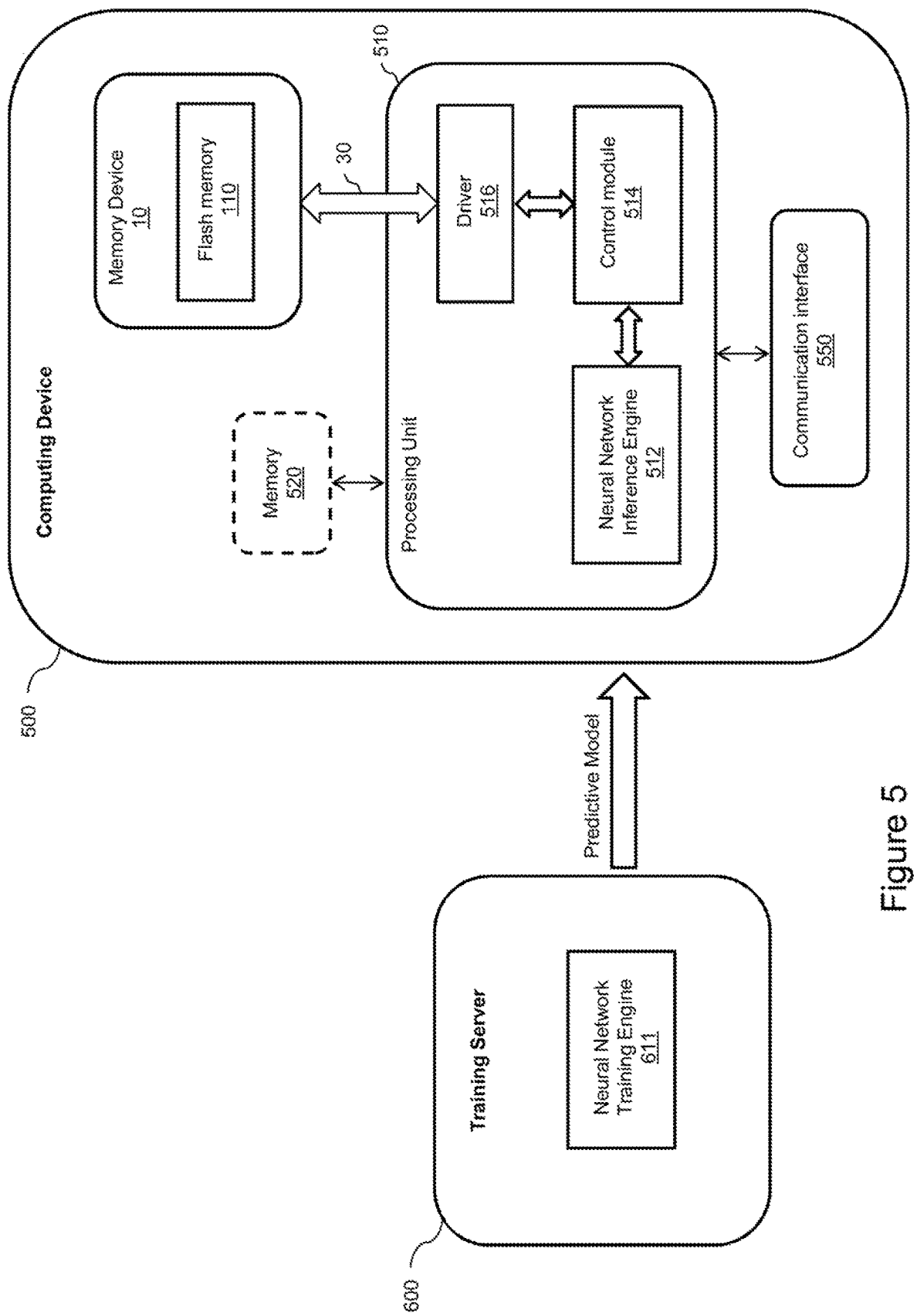
FIG. 5 represents a computing device comprising a flash memory and executing a neural network inference engine.
Figure 6:
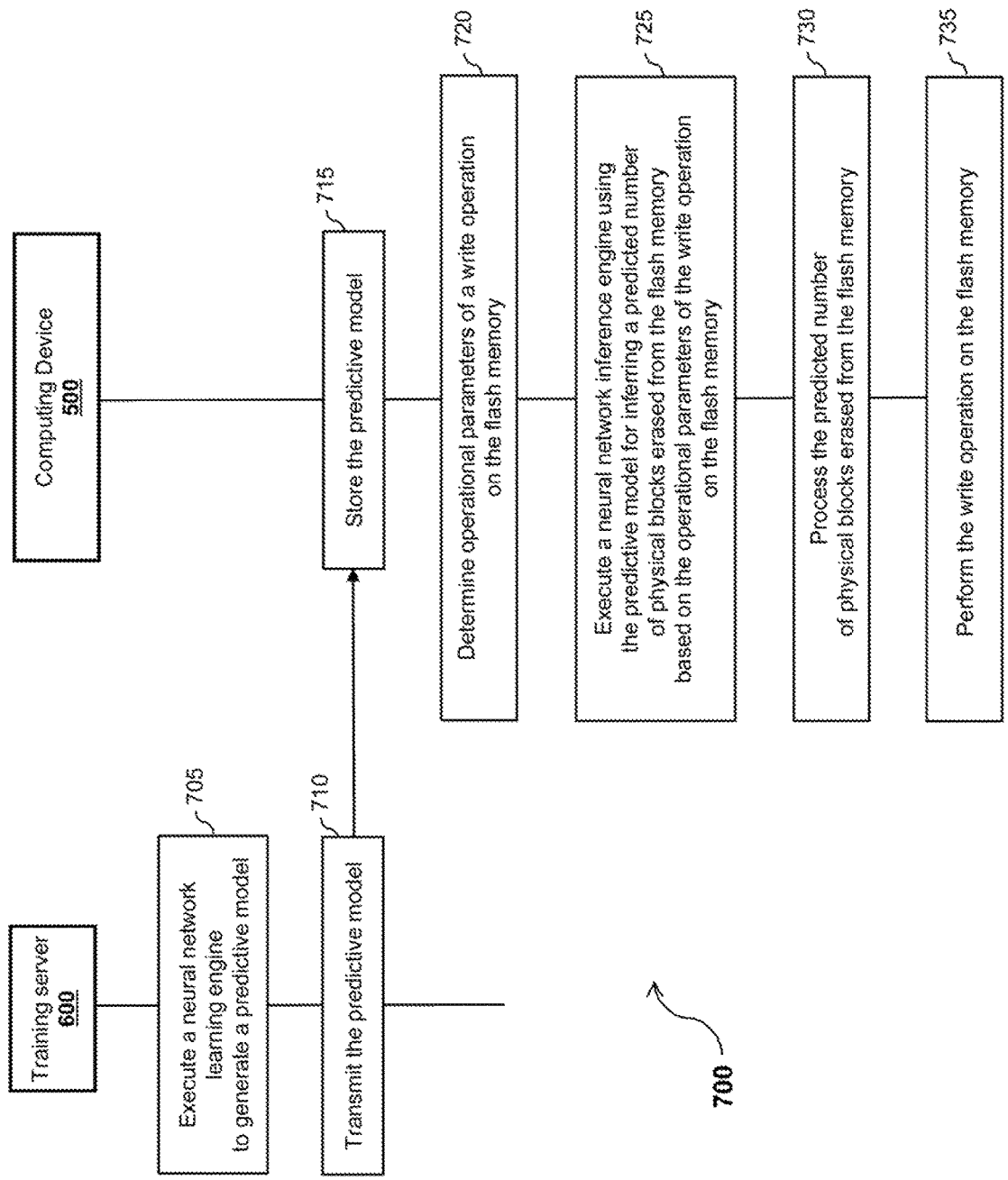
FIG. 6 represents a method executed by the computing device of FIG. 5 for inferring a predicted number of physical blocks erased from the flash memory.

Referring now concurrently to FIGS. 1, 5 and 6, a computing device 500 (represented in FIG. 5) and a method 700 (represented in FIG. 6) for inferring a predicted number of physical blocks erased from the flash memory 110 of the computing device 500 through the usage of a neural network are illustrated.

The computing device 500 comprises a processing unit 510, an optional memory 520, the memory device 10 comprising the flash memory 110, and a communication interface 550. The computing device 500 may comprise additional components (not represented in FIG. 5 for simplification purposes), such as a user interface, a display, another communication interface, etc.

The memory device 10 comprising the flash memory 110 of FIG. 5 corresponds to the memory device 10 comprising the flash memory 110 of FIG. 1. The processing unit 510 of FIG. 5 corresponds to the host device 20 of FIG. 1. The physical blocks 112 of the flash memory 110 represented in FIG. 1 are not represented in FIG. 5 for simplification purposes.

The processing unit 510 comprises one or more processors (not represented in FIG. 5) capable of executing instructions of a computer program. Each processor may further comprise one or several cores.

The memory 520 stores instructions of computer program(s) executed by the processing unit 510, data generated by the execution of the computer program(s), data received via the communication interface 550, etc. Only a single memory 650 is represented in FIG. 5, but the computing device 500 may comprise several types of memories, including volatile memory (such as a volatile Random Access Memory (RAM)) and non-volatile memory (such as a hard drive). Alternatively, at least some of the aforementioned data are not stored in the memory 520, but are stored in the flash memory 110 of the memory device 10. In still another alternative, there is no memory 520, and all of the aforementioned data are stored in the flash memory 110 of the computing device 10.

The steps of the method 700 are implemented by the computing device 500, to infer a predicted number of physical blocks erased from the flash memory 110 through the usage of a neural network.

A dedicated computer program has instructions for implementing the steps of the method 700. The instructions are comprised in a non-transitory computer program product (e.g. the memory 520 or the flash memory 110) of the computing device 500. The instructions provide for inferring a predicted number of physical blocks erased from a flash memory 110 through the usage of a neural network, when executed by the processing unit 510 of the computing device 500. The instructions are deliverable to the computing device 500 via an electronically-readable media such as a storage media (e.g. CD-ROM, USB key, etc.), or via communication links (e.g. via a communication network (not represented in FIG. 5 for simplification purposes) through the communication interface 550).

The instructions comprised in the dedicated computer program product, and executed by the processing unit 510, implement a neural network inference engine 512, a control module 514, and a driver 516.

The driver 516 controls the exchange of data over the bus 30 between the control module 514 executed by the processing unit 510 and the host interface 100 (represented in FIG. 1) of the memory device 10. The functionalities of the driver 516 are well known in the art.

Also represented in FIG. 5 is a training server 600. Although not represented in FIG. 5 for simplification purposes, the training server 600 comprises a processing unit, memory and a communication interface. The processing unit of the training server 600 executes a neural network training engine 611.

The execution of the neural network training engine 611 generates a predictive model, which is transmitted to the computing device 500 via the communication interface of the training server 600. The predictive model is received via the communication interface 550 of the computing device 500, stored in the memory 520 (or flash memory 110), and used by the neural network inference engine 512. The control module 514 controls the operations of the neural network inference engine 512.

The method 700 comprises the step 705 of executing the neural network training engine 611 (by the processing unit of the training server 600) to generate the predictive model. This step is similar to step 405 of the method 400 represented in FIG. 4.

The method 700 comprises the step 710 of transmitting the predictive model to the computing device 500, via the communication interface of the training server 600.

The method 700 comprises the step 715 of storing the predictive model in the memory 520 (or the flash memory 110) of the computing device 500. The predictive model is received via the communication interface 550 (or another communication interface not represented in FIG. 5) of the computing device 500, and stored in the memory 520 by the processing unit 510.

The method 700 comprises the step 720 of determining operational parameters of a write operation on the flash memory 110. This step is performed by the control module 514; and will be detailed later in the description, when the operational parameters of the flash memory 110 are disclosed.

The method 700 comprises the step 725 of executing the neural network inference engine 512 (by the processing unit 510). The neural network inference engine 512 uses the predictive model (stored in memory 520 or flash memory 110 at step 715) for inferring a predicted number of physical blocks erased from the flash memory 110 based on the operational parameters of the write operation on the flash memory 110 (determined at step 720). This step is performed under the control of the control module 514, which feeds the operational parameters of the flash memory 110 to the neural network inference engine 512, and receives the inferred predicted number of physical blocks erased from the flash memory 110 from the neural network inference engine 512.

The method 700 comprises the step 730 of processing the predicted number (inferred at step 725) of physical blocks erased from the flash memory 110. This step is performed by the control module 514, which receives the predicted number of physical blocks erased from the flash memory 110 from the neural network inference engine 512. This step will be detailed later in the description, when the operational parameters of the flash memory 110 are disclosed.

The method 700 comprises the step 735 of performing the write operation on the flash memory 110. The execution of this step has been previously described in relation to FIGS. 1 and 2.

Once steps 705, 710 and 715 have been performed, steps 720, 725, 730 and 735 can be repeated a plurality of time, with different operational parameters of the write operation on the flash memory 110 at step 720 at each repetition of steps 720, 725, 730 and 735.

In an alternative configuration, an inference server (not represented in FIG. 5) executes the neural network inference engine 512. The inference server receives the predictive model from the training server 600 and performs step 715 of the method 700 consisting in storing the received predictive model in a memory of the inference server. After performing step 720 of the method 700, the computing device 500 transmits the operational parameters of the write operation on the flash memory 110 to the inference server. The inference server performs step 725 of the method 700 consisting in executing the neural network inference engine 512 (by a processing unit of the inference server), which uses the predictive model for inferring a predicted number of physical blocks erased from the flash memory 110 based on the operational parameters of the write operation on the flash memory 110. The inference server transmits the predicted number of physical blocks erased from the flash memory 110 to the computing device 500, which then performs steps 730 and 735 of the method 700. Thus, in this alternative configuration, the computing device 500 does not execute the neural network inference engine 512, and does not perform steps 715 and 725, which are performed instead by the inference server.

Reference is now made concurrently to FIGS. 1, 3 and 5, and more particularly to the neural network inference engine (312 or 512) and the neural network training engine (311 or 611), in the context of the methods 400 and 700 respectively represented in FIGS. 4 and 6.

Various types of operational parameters of the flash memory 110 may affect the number of physical blocks 112 erased from the flash memory 110 when performing a current write operation on the flash memory 110. The present disclosure aims at providing a mechanism for inferring a number of physical blocks 112 erased from the flash memory 110 when performing a current write operation on the flash memory 110. The inferred number of physical blocks 112 erased shall be as close as possible to the actual number of physical blocks 112 erased when performing the current write operation on the flash memory 110. The mechanism disclosed in the present disclosure takes advantage of the neural network technology to "guess" the number of physical blocks 112 erased when performing the current write operation on the flash memory 110.

Following are examples of operational parameters of the flash memory 110, which are used as inputs of the neural network training engine 311 or 611 (during a training phase) and the neural network inference engine 312 or 512 (during an operational phase).

One operational parameter is a total number of physical blocks 112 previously erased from the flash memory 110. This total number of previously erased physical blocks 112 is the addition of a plurality of numbers of physical blocks 112 erased from the flash memory 110 when performing a corresponding plurality of previous write operations on the flash memory 110. For more accuracy, the total number of physical blocks 112 previously erased from the flash memory 110 shall take into consideration all the erase operations previously performed on the flash memory 110 since the beginning of the usage of the flash memory 110.

Another operational parameter is an amount of data to be written on the flash memory 110 for performing the current write operation on the flash memory 110. For example, this amount of data is expressed as a number of bytes, a number of kilobytes, a number of megabytes, etc.

Still another operational parameter is a temperature at which the flash memory 110 is operating. The evaluation of the temperature at which the flash memory 110 is operating is more or less precise, based on how it is measured. For example, the temperature is a temperature of a room where the computing device (e.g. 500) hosting the flash memory 110 is located. Alternatively, the temperature is a temperature measured by a temperature sensor comprised in the computing device (e.g. 500) hosting the flash memory 110. The position of the temperature sensor with respect to the memory device 10 embedding the flash memory 110 may vary. The temperature sensor may be positioned within the memory device 10, to be closer to the flash memory 110.

Yet another operational parameter consists of one or more characteristics of the flash memory 110. Examples of characteristics of the flash memory 110 include a manufacturer of the flash memory 110, a model of the flash memory 110, a capacity of the flash memory 110, a number of physical blocks 112 of the flash memory 110, a capacity of the physical blocks 112 of the flash memory 110, etc.

A person skilled in the art would readily understand that additional operational parameters may have an impact on the number of physical blocks 112 erased from the flash memory 110 when performing a current write operation on the flash memory 110, and can also be taken into consideration by the neural network inference engine (312 or 512) and the neural network training engine (311 or 611).

Furthermore, a combination of the aforementioned operational parameters is taken into consideration by the neural network inference engine (312 or 512) and the neural network training engine (311 or 611). The best combination can be determined during the learning phase with the neural network training engine (311 or 611). The best combination may depend on one or more characteristics of the flash memory 110. The training phase can be used to identify the best combination of operational parameters, and only those operational parameters will be used by the neural network training engine (311 or 611) to generate the predictive model used by the neural network inference engine (312 or 512).

Alternatively, all the available operational parameters can be used by the neural network training engine (311 or 611) to generate the predictive model. In this case, the neural network training engine (311 or 611) will simply learn to ignore the operational parameters which do not have a significant influence on the number of physical blocks 112 erased from the flash memory 110 when performing a current write operation on the flash memory 110. For example, the temperature may not have an impact (at least for a type of flash memory 110 having on one or more specific characteristics), in which case it will be ignored by the predictive model.

During the learning phase, the neural network training engine (311 or 611) is trained with a plurality of inputs corresponding to the operational parameters of the flash memory 110, and a corresponding plurality of outputs corresponding to the measured (or at least evaluated as precisely as possible) number of physical blocks 112 erased from the flash memory 110 when performing a current write operation on the flash memory 110.

As is well known in the art of neural network, during the training phase, the neural network implemented by the neural network training engine (311 or 611) adjusts its weights. Furthermore, during the learning phase, the number of layers of the neural network and the number of nodes per layer can be adjusted to improve the accuracy of the model. At the end of the training phase, the predictive model generated by the neural network training engine (311 or 611) includes the number of layers, the number of nodes per layer, and the weights.

The inputs and outputs for the learning phase of the neural network can be collected through an experimental process. For example, a test computing device 500 is placed in various operating conditions corresponding to various values of the operational parameters of the flash memory 110. For each set of values of the operational parameters, the number of physical blocks 112 erased from the flash memory 110 is determined and used as the output for the neural network.

At a current iteration of the learning phase, the set of values comprises the current total number of physical blocks previously erased from the flash memory 110, and an amount of data to write on the flash memory 110. The control module 514 of the computing device 500 orders the driver 516 to transfer data corresponding to the amount of data to the memory device 10 via the bus 30, and the data corresponding to the amount of data are written on the flash memory 110. In return, the driver 516 receives from the memory device 10 the number of physical blocks 112 erased from the flash memory 110 for performing the write operation of the data corresponding to the amount of data (based on FIGS. 1, 2 and 5, the number of physical blocks 112 erased from the flash memory 110 is reported by the flash memory controller 120 to the host interface 100, and from the host interface 100 to the driver 516).

The neural network training engine 611 of the training server 600 is trained with this set of data for the current iteration: the current total number of physical blocks previously erased from the flash memory 110, the amount of data to write on the flash memory 110, optionally a temperature at which the flash memory 110 is operating measured by a temperature sensor, optionally one or more characteristics of the flash memory 110, and the reported number of physical blocks 112 erased from the flash memory 110.

The current total number of physical blocks previously erased from the flash memory 110 is then updated with the reported number of physical blocks 112 erased from the flash memory 110, and the next iteration of the learning phase is performed.

The training phase is performed under the control of a user. For instance, the user specifies via a user interface of the computing device 500 the amount of data to write on the flash memory 110 at each iteration. This amount of data is varied at will by the user. Similarly, the temperature at which the flash memory 110 is operating is varied by the user. Furthermore, various types of flash memory 110 are used, in order to vary one or more characteristics of the flash memory 110. A plurality of variations and combinations of the operational parameters is performed under the direction of the user, until a robust predictive model is generated by the neural network training engine 611.

Alternatively, the inputs and outputs for the learning phase of the neural network can be collected through a mechanism for automatically collecting data while the computing device 500 is operating in real conditions. For example, a collecting software is executed by the processing unit 510 of the computing device 500. In this case, the collection of data is not directed by a user for the sole purpose of feeding inputs and outputs to the neural network training engine 611. The collecting software records various operating conditions when write operations are performed on the flash memory 110. More specifically, the collecting software records and updates the total number of physical blocks previously erased from the flash memory 110. The collecting software also records the amount of data to write on the flash memory 110 for a write operation, optionally a temperature at which the flash memory 110 is operating measured by a temperature sensor embedded in the computing device 500 (or a temperature sensor located outside the computing device 500, but reachable through the communication interface 550), and the reported number of physical blocks 112 erased from the flash memory 110 for each write operation.

Various techniques well known in the art of neural networks are used for performing (and improving) the generation of the predictive model, such as forward and backward propagation, usage of bias in addition to the weights (bias and weights are generally collectively referred to as weights in the neural network terminology), reinforcement learning, etc.

During the operational phase, the neural network inference engine (312 or 512) uses the predictive model (e.g. the values of the weights) determined during the learning phase to infer an output (the predicted number of physical blocks 112 erased from the flash memory 110 when performing a current write operation on the flash memory 110) based on inputs (the operational parameters of the flash memory 110), as is well known in the art.

Reference is now made concurrently to FIGS. 3 and 4, where the computing device 300 does not include a flash memory.

As mentioned previously, at step 415 of the method 400, the operational parameters of the write operation on the flash memory are not operational parameters of a flash memory embedded in the computing device 300. The operational parameters are either provided by a user via a user interface of the computing device 300, or received from a remote computing entity via the communication interface 330.

Similarly, with respect to step 425 of the method 400, the processing of the predicted number of physical blocks erased from the flash memory does not involve taking actions for preserving the lifespan of a flash memory embedded in the computing device 300. As mentioned previously, the predicted number of physical blocks erased from the flash memory is either displayed on a display of the computing device 300, or transmitted to one or more remote computing entities via the communication interface 330.

Thus, the neural network inference engine 312 can be used for simulation purposes. For example, different scenarios are tested for evaluating the lifespan of a flash memory, taking into consideration various operating conditions of the flash memory.

Reference is now made concurrently to FIGS. 1, 5 and 6, where the computing device 500 includes the flash memory 110.

By contrast to steps 415 and 420 of the method 400 illustrated in FIG. 4, at steps 720 and 725 of the method 700, the operational parameters of the write operation on the flash memory are operational parameters of the flash memory 110 embedded in the computing device 500.

Thus, with respect to step 730 of the method 700, the processing of the predicted number of physical blocks erased from the flash memory 110 involves taking actions for preserving the lifespan of the flash memory 110 embedded in the computing device 500. For example, the predicted number of physical blocks erased from the flash memory 110 is taken into consideration optionally in combination with other information related to previous write operations on the flash memory 110, for determining if an action for preserving the lifespan of the flash memory 110 shall be taken for the current write operation. The resulting actions for preserving the lifespan of the flash memory 110 may include preventing some of the write operations on the flash memory 110, reducing the write speed of the bus 30 for limiting the amount of data written on the flash memory 110 through the bus 30, aggregating several write operations on the flash memory 110 (writing a single larger amount of data instead of several smaller amounts of data may reduce the overall number of physical blocks erased from the flash memory 110), etc.

At step 735, the actual number of physical blocks 112 erased from the flash memory 110 by the wrote operation is reported by the flash memory controller 120 to the host interface 100, from the host interface 100 to the driver 516, and from the driver 516 to the control module 514. The actual number of physical blocks 112 erased from the flash memory 110 is used at step 720 for updating the total number of physical blocks 112 previously erased from the flash memory 110.

Furthermore, the write operation performed at 735 consists in writing on the flash memory 110 the amount of data determined at step 720; except if it is determined at step 730 that an action for preserving the lifespan of the flash memory 110 shall be taken for the current write operation, which may affect the actual amount of data written on the flash memory 110 for the current write operation.

Figure 7:
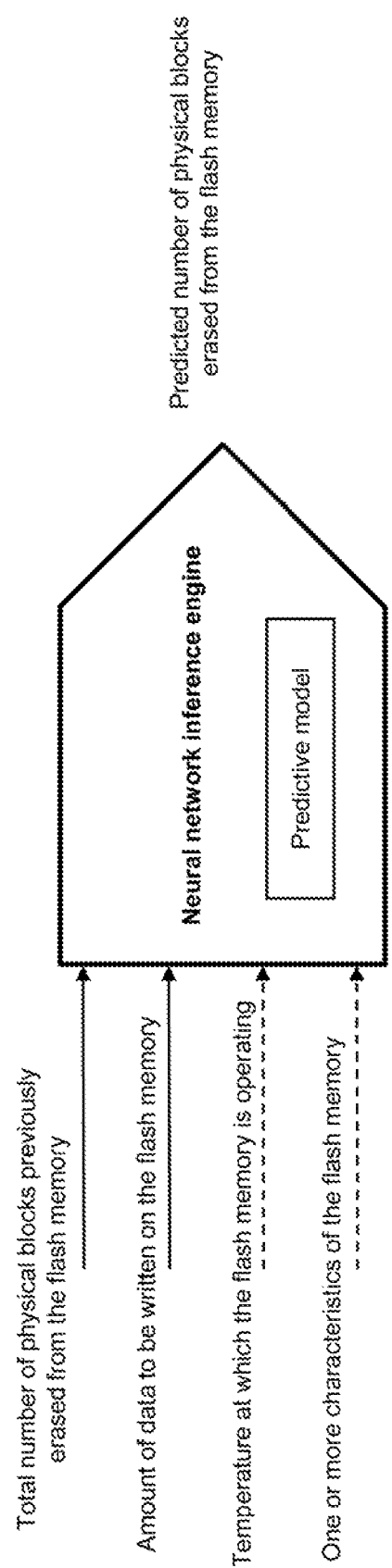
FIG. 7 is a schematic representation of the neural network inference engine executed by the computing devices of FIGS. 3 and 5, and corresponding to the methods of FIGS. 4 and 6.

Reference is now made to FIG. 7, which illustrates the aforementioned neural network inference with its inputs and its output. FIG. 7 corresponds to the neural network inference engine 312 executed at step 420 of the method 400, as illustrated in FIGS. 3 and 4. FIG. 7 also corresponds to the neural network inference engine 512 executed at step 725 of the method 700, as illustrated in FIGS. 5 and 6.

Figure 8:
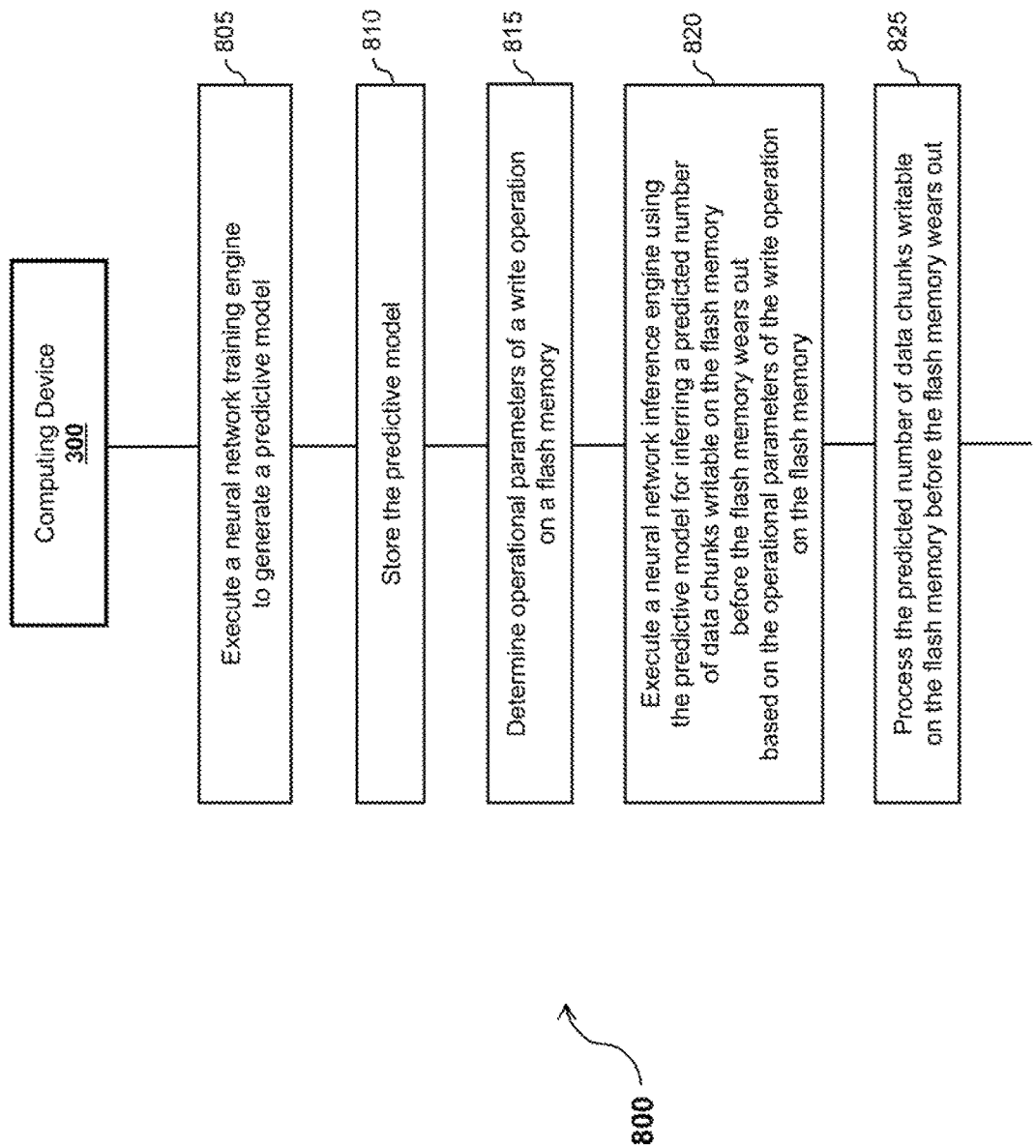
FIG. 8 represents a method executed by the computing device of FIG. 3 for inferring a predicted number of data chunks writable on a flash memory before the flash memory wears out.

Referring now concurrently to FIGS. 3 and 8, the computing device 300 (represented in FIG. 3) and a method 800 (represented in FIG. 8) for inferring a predicted number of data chunks writable on a flash memory before the flash memory wears out, through the usage of a neural network, are illustrated. The flash memory in question corresponds the flash memory (110) of the memory device (10) represented in FIG. 1.

The steps of the method 800 are implemented by the computing device 300, to infer a predicted number of data chunks writable on a flash memory before the flash memory wears out, through the usage of a neural network.

A dedicated computer program has instructions for implementing the steps of the method 800. The instructions are comprised in a non-transitory computer program product (e.g. the memory 320) of the computing device 300. The instructions provide for inferring a predicted number of data chunks writable on a flash memory before the flash memory wears out, through the usage of a neural network, when executed by the processing unit 310 of the computing device 300. The instructions are deliverable to the computing device 300 via an electronically-readable media such as a storage media (e.g. CD-ROM, USB key, etc.), or via communication links (e.g. via a communication network (not represented in FIG. 3 for simplification purposes) through the communication interface 330).

The instructions comprised in the dedicated computer program product, and executed by the processing unit 310, implement the neural network training engine 311, the neural network inference engine 312, and the control module 314.

The execution of the neural network training engine 311 generates a predictive model, which is stored in the memory 320 and used by the neural network inference engine 312. The control module 314 controls the operations of the neural network training engine 311 and the neural network inference engine 312.

The method 800 comprises the step 805 of executing the neural network training engine 311 (by the processing unit 310 of the computing device 300) to generate the predictive model. This step is similar to step 405 of the method 400 represented in FIG. 4; except for the inputs and outputs used by the neural network training engine 311 for generating the predictive model. The inputs and outputs will be detailed later in the description.

The method 800 comprises the step 810 of storing the predictive model in the memory 320 of the computing device 300. This step is similar to step 410 of the method 400 represented in FIG. 4.

The method 800 comprises the step 815 of determining operational parameters of a write operation on a flash memory. This step is similar to step 415 of the method 400 represented in FIG. 4; except for the operational parameters will be detailed later in the description.

The method 800 comprises the step 820 of executing the neural network inference engine 312 (by the processing unit 310). The neural network inference engine 312 uses the predictive model (stored in memory 320 at step 810) for inferring a predicted number of data chunks writable on the flash memory before the flash memory wears out, based on the operational parameters of the write operation on the flash memory (determined at step 815). This step is similar to step 420 of the method 400 represented in FIG. 4; except for the inputs and the output of the neural network inference engine 312.

The method 800 comprises the step 825 of processing the predicted number (inferred at step 820) of data chunks writable on the flash memory before the flash memory wears out. This step is similar to step 425 of the method 400 represented in FIG. 4.

Once steps 805 and 810 have been performed, steps 815, 820 and 825 can be repeated a plurality of time, with different operational parameters of the write operation on the flash memory at step 815 at each repetition of steps 815, 820 and 825.

Figure 9:
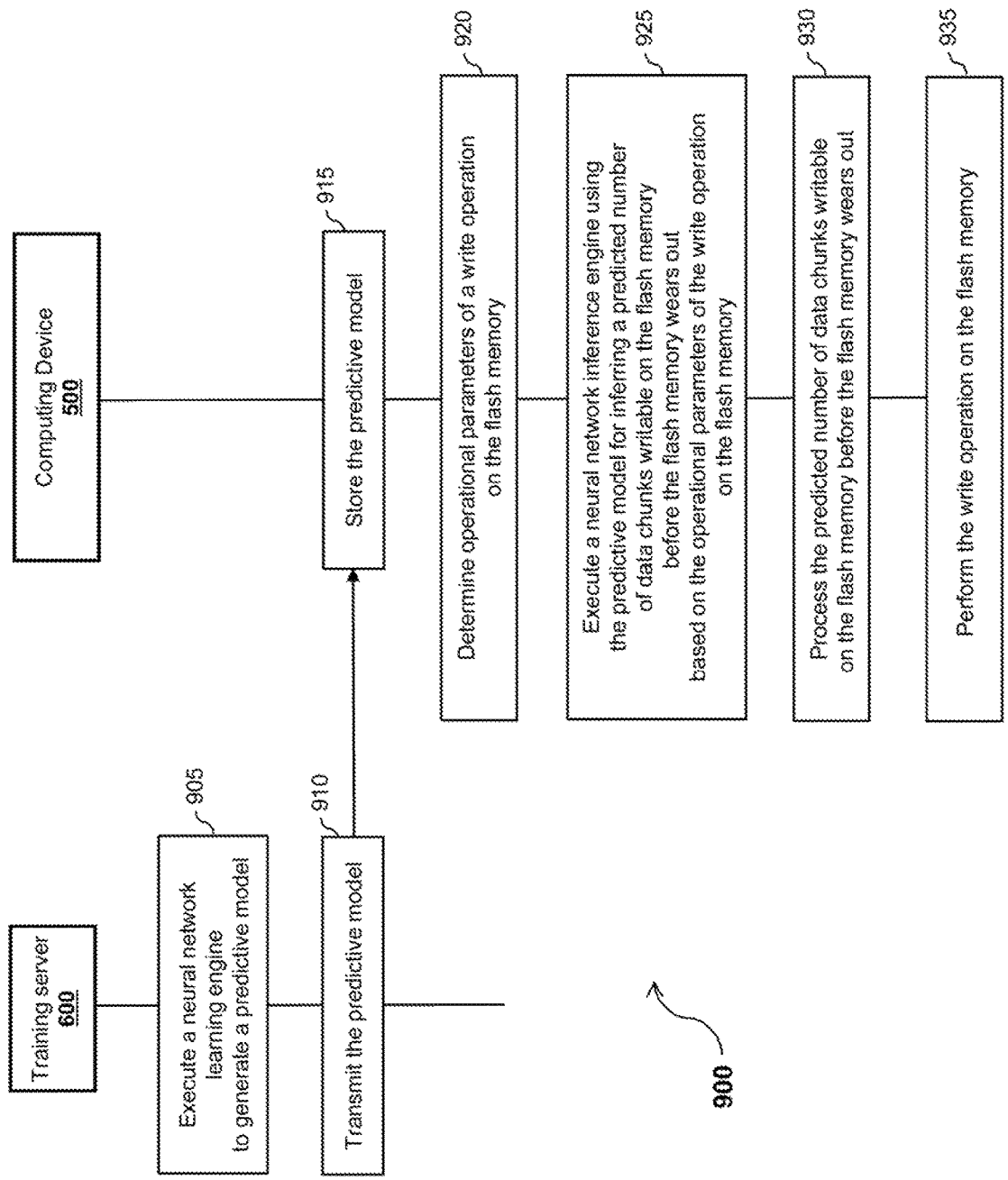
FIG. 9 represents a method executed by the computing device of FIG. 5 for inferring a predicted number of data chunks writable on the flash memory before the flash memory wears out.

Referring now concurrently to FIGS. 1, 5 and 9, the computing device 500 (represented in FIG. 5) and a method 900 (represented in FIG. 9) for inferring a predicted number of data chunks writable on a flash memory before the flash memory wears out, through the usage of a neural network, are illustrated.

As mentioned previously with reference to FIG. 5, the memory device 10 comprising the flash memory 110 of FIG. 5 corresponds to the memory device 10 comprising the flash memory 110 of FIG. 1. The processing unit 510 of FIG. 5 corresponds to the host device 20 of FIG. 1. The physical blocks 112 of the flash memory 110 represented in FIG. 1 are not represented in FIG. 5 for simplification purposes.

The steps of the method 900 are implemented by the computing device 500, to infer a predicted number of data chunks writable on the flash memory 110 before the flash memory 110 wears out, through the usage of a neural network.

A dedicated computer program has instructions for implementing the steps of the method 900. The instructions are comprised in a non-transitory computer program product (e.g. the memory 520 or the flash memory 110) of the computing device 500. The instructions provide for inferring a predicted number of data chunks writable on the flash memory 110 before the flash memory 110 wears out, through the usage of a neural network, when executed by the processing unit 510 of the computing device 500. The instructions are deliverable to the computing device 500 via an electronically-readable media such as a storage media (e.g. CD-ROM, USB key, etc.), or via communication links (e.g. via a communication network (not represented in FIG. 5 for simplification purposes) through the communication interface 550).

The instructions comprised in the dedicated computer program product, and executed by the processing unit 510, implement the neural network inference engine 512, the control module 514, and the driver 516.

The execution of the neural network training engine 611 generates a predictive model, which is transmitted to the computing device 500 via the communication interface of the training server 600. The predictive model is received via the communication interface 550 of the computing device 500, stored in the memory 520 (or flash memory 110), and used by the neural network inference engine 512. The control module 514 controls the operations of the neural network inference engine 512.

The method 900 comprises the step 905 of executing the neural network training engine 611 (by the processing unit of the training server 600) to generate the predictive model. This step is similar to step 705 of the method 700 represented in FIG. 6; except for the inputs and outputs used by the neural network training engine 611 for generating the predictive model. The inputs and outputs will be detailed later in the description.

The method 900 comprises the step 910 of transmitting the predictive model to the computing device 500, via the communication interface of the training server 600. This step is similar to step 710 of the method 700 represented in FIG. 6.

The method 900 comprises the step 915 of storing the predictive model in the memory 520 (or the flash memory 110) of the computing device 500. This step is similar to step 715 of the method 700 represented in FIG. 6.

The method 900 comprises the step 920 of determining operational parameters of a write operation on the flash memory 110. This step is similar to step 720 of the method 700 represented in FIG. 6; except for the operational parameters will be detailed later in the description.

The method 900 comprises the step 925 of executing the neural network inference engine 512 (by the processing unit 510). The neural network inference engine 512 uses the predictive model (stored in memory 520 or flash memory 110 at step 915) for inferring a predicted number of data chunks writable on the flash memory 110 before the flash memory 110 wears out, based on the operational parameters of the write operation on the flash memory 110 (determined at step 920). This step is similar to step 725 of the method 700 represented in FIG. 6; except for the inputs and the output of the neural network inference engine 512.

The method 900 comprises the step 930 of processing the predicted number (inferred at step 925) of data chunks writable on the flash memory 110 before the flash memory 110 wears out. This step is similar to step 730 of the method 700 represented in FIG. 6.

The method 900 comprises the step 935 of performing the write operation on the flash memory 110. This step is similar to step 735 of the method 700 represented in FIG. 6.

Once steps 905, 910 and 915 have been performed, steps 920, 925, 930 and 935 can be repeated a plurality of time, with different operational parameters of the write operation on the flash memory 110 at step 920 at each repetition of steps 920, 925, 930 and 935.

Reference is now made concurrently to FIGS. 1, 3, and 5, and more particularly to the neural network inference engine (312 or 512) and the neural network training engine (311 or 611), in the context of the methods 800 and 900 respectively represented in FIGS. 8 and 9.

Various types of operational parameters of the flash memory 110 may affect the number of data chunks writable on the flash memory 110 before the flash memory 110 wears out. The present disclosure aims at providing a mechanism for inferring a number of data chunks writable on the flash memory 110 before the flash memory 110 wears out. The inferred number of writable data chunks shall be as close as possible to the actual number of writable data chunks. The mechanism disclosed in the present disclosure takes advantage of the neural network technology to "guess" the number of writable data chunks.

Following are examples of operational parameters of the flash memory 110, which are used as inputs of the neural network training engine 311 or 611 (during a training phase) and the neural network inference engine 312 or 512 (during an operational phase).

One operational parameter is a total number of physical blocks 112 previously erased from the flash memory 110. This total number of previously erased physical blocks 112 is the addition of a plurality of numbers of physical blocks 112 erased from the flash memory 110 when performing a corresponding plurality of previous write operations on the flash memory 110. This operational parameter is the same as the one used in the context of the methods 400 and 700 respectively represented in FIGS. 4 and 6.

Another operational parameter is a size of the chunk of data. For example, this size is expressed as a number of bytes, a number of kilobytes, a number of megabytes, etc. This operational parameter is similar to the amount of data to be written on the flash memory 110 used in the context of the methods 400 and 700 respectively represented in FIGS. 4 and 6.

Still another operational parameter is a temperature at which the flash memory 110 is operating. This operational parameter is the same as the one used in the context of the methods 400 and 700 respectively represented in FIGS. 4 and 6.

Yet another operational parameter consists of one or more characteristics of the flash memory 110. This operational parameter is the same as the one used in the context of the methods 400 and 700 respectively represented in FIGS. 4 and 6.

A person skilled in the art would readily understand that additional operational parameters may have an impact on the number of data chunks writable on the flash memory 110 before the flash memory 110 wears out, and can also be taken into consideration by the neural network inference engine (312 or 512) and the neural network training engine (311 or 611).

Furthermore, a combination of the aforementioned operational parameters is taken into consideration by the neural network inference engine (312 or 512) and the neural network training engine (311 or 611). The best combination can be determined during the learning phase with the neural network training engine (311 or 611). The best combination may depend on one or more characteristics of the flash memory 110. The training phase can be used to identify the best combination of operational parameters, and only those operational parameters will be used by the neural network training engine (311 or 611) to generate the predictive model used by the neural network inference engine (312 or 512). Alternatively, all the available operational parameters can be used by the neural network training engine (311 or 611) to generate the predictive model. In this case, the neural network training engine (311 or 611) will simply learn to ignore the operational parameters which do not have a significant influence on the number of data chunks writable on the flash memory 110 before the flash memory 110 wears out. For example, the temperature may not have an impact (at least for a type of flash memory 110 having on one or more specific characteristics), in which case it will be ignored by the predictive model.

During the learning phase, the neural network training engine (311 or 611) is trained with a plurality of inputs corresponding to the operational parameters of the flash memory 110, and a corresponding plurality of outputs corresponding to the measured (or at least evaluated as precisely as possible) number of data chunks writable on the flash memory 110 before the flash memory 110 wears out.

As is well known in the art of neural network, during the training phase, the neural network implemented by the neural network training engine (311 or 611) adjusts its weights. Furthermore, during the learning phase, the number of layers of the neural network and the number of nodes per layer can be adjusted to improve the accuracy of the model. At the end of the training phase, the predictive model generated by the neural network training engine (311 or 611) includes the number of layers, the number of nodes per layer, and the weights.

The inputs and outputs for the learning phase of the neural network can be collected through an experimental process. For example, a test computing device 500 is placed in various operating conditions corresponding to various values of the operational parameters of the flash memory 110. For each set of values of the operational parameters, the number of data chunks writable on the flash memory 110 before the flash memory 110 wears out is determined and used as the output for the neural network.

In order to determine the number of data chunks writable on the flash memory 110 before the flash memory 110 wears out, a succession of write operations on the flash memory 110 of the test computing device 500 is performed. For each write operation, a data chunk of the size used as an input to the neural network training engine (311 or 611) is written on the flash memory 110 of the test computing device 500. After a plurality of write operations have been performed, the flash memory 110 of the test computing device 500 effectively wears out; and the number of write operations is used as the output for the neural network training engine (311 or 611). Furthermore, the total number of physical blocks 112 previously erased from the flash memory 110 of the test computing device 500 needs to be known before performing the succession of write operations, since it is one of the inputs for the neural network training engine (311 or 611). As mentioned previously in the description, by recording the number of physical blocks 112 erased from the flash memory 110 of the test computing device 500 after each write operation on the flash memory 110, the total number of physical blocks 112 previously erased from the flash memory 110 can be determined and updated after each write operation on the flash memory 110.

The training phase is performed under the control of a user. For instance, the user specifies via a user interface of the test computing device 500 the size of the data chunk to be iteratively written until the flash memory 110 wears out. This size of the data chunk is varied at will by the user. Similarly, the temperature at which the flash memory 110 is operating is varied by the user. Furthermore, various types of flash memory 110 are used, in order to vary one or more characteristics of the flash memory 110. A plurality of variations and combinations of the operational parameters is performed under the direction of the user, until a robust predictive model is generated by the neural network training engine 611. Only the total number of physical blocks 112 previously erased from the flash memory 110 is not a parameter under the control of the user, but is an operating parameter of the flash memory 110 currently in use for performing the learning phase.

During the operational phase, the neural network inference engine (312 or 512) uses the predictive model (e.g. the values of the weights) determined during the learning phase to infer an output (the predicted number of data chunks writable on the flash memory 110 before the flash memory 110 wears out) based on inputs (the operational parameters of the flash memory 110), as is well known in the art.

Reference is now made concurrently to FIGS. 3 and 8, where the computing device 300 does not include a flash memory.

As mentioned previously, at step 815 of the method 800, the operational parameters of the write operation on the flash memory are not operational parameters of a flash memory embedded in the computing device 300. The operational parameters are either provided by a user via a user interface of the computing device 300, or received from a remote computing entity via the communication interface 330.

Similarly, with respect to step 825 of the method 800, the processing of the predicted number of data chunks writable on the flash memory before the flash memory wears out does not involve taking actions for preserving the lifespan of a flash memory embedded in the computing device 300. As mentioned previously, the predicted number of data chunks writable on the flash memory 110 before the flash memory 110 wears out is either displayed on a display of the computing device 300, or transmitted to one or more remote computing entities via the communication interface 330.

Thus, the neural network inference engine 312 can be used for simulation purposes. For example, different scenarios are tested for evaluating the lifespan of a flash memory, taking into consideration various operating conditions of the flash memory.

Reference is now made concurrently to FIGS. 1, 5 and 9, where the computing device 500 includes the flash memory 110.

By contrast to steps 815 and 820 of the method 800 illustrated in FIG. 8, at steps 920 and 925 of the method 900, the operational parameters of the write operation on the flash memory are operational parameters of the flash memory 110 embedded in the computing device 500.

Thus, with respect to step 930 of the method 900, the processing of the predicted number of data chunks writable on the flash memory 110 before the flash memory 110 wears out involves taking actions for preserving the lifespan of the flash memory 110 embedded in the computing device 500. For example, the predicted number of data chunks writable on the flash memory 110 before the flash memory 110 wears out is taken into consideration optionally in combination with other information related to operating conditions of the flash memory 110, for determining if an action for preserving the lifespan of the flash memory 110 shall be taken for the current write operation. The resulting actions for preserving the lifespan of the flash memory 110 may include preventing some of the write operations on the flash memory 110, reducing the write speed of the bus 30 for limiting the amount of data written on the flash memory 110 through the bus 30, aggregating several write operations on the flash memory 110 (writing a single larger amount of data instead of several smaller amounts of data may reduce the overall number of physical blocks erased from the flash memory 110), etc.

At step 935, the number of physical blocks 112 erased from the flash memory 110 by the write operation is reported by the flash memory controller 120 to the host interface 100, from the host interface 100 to the driver 516, and from the driver 516 to the control module 514. The number of physical blocks 112 erased from the flash memory 110 is used at step 920 for updating the total number of physical blocks 112 previously erased from the flash memory 110.

Furthermore, the write operation performed at 935 consists in writing on the flash memory 110 the chunk of data having a size determined at step 920; except if it is determined at step 930 that an action for preserving the lifespan of the flash memory 110 shall be taken for the current write operation, which may affect the size of the data written on the flash memory 110 for the current write operation.

Figure 10:
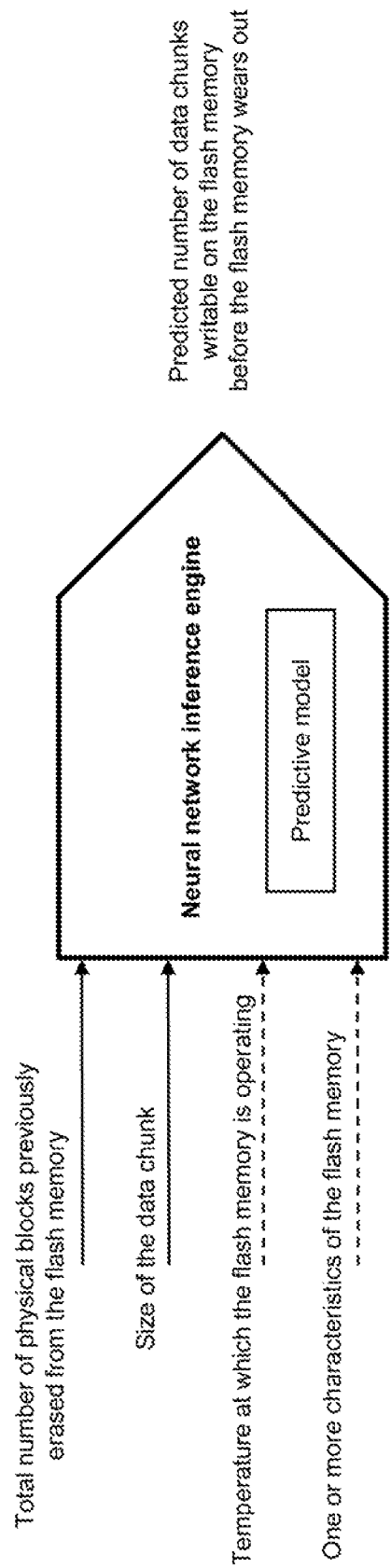
FIG. 10 is another schematic representation of the neural network inference engine executed by the computing devices of FIGS. 3 and 5, and corresponding to the methods of FIGS. 8 and 9.

Reference is now made to FIG. 10, which illustrates the aforementioned neural network inference engine with its inputs and its output. FIG. 10 corresponds to the neural network inference engine 312 executed at step 820 of the method 800, as illustrated in FIGS. 3 and 8. FIG. 10 also corresponds to the neural network inference engine 512 executed at step 925 of the method 900, as illustrated in FIGS. 5 and 9.

Although the present disclosure has been described hereinabove by way of non-restrictive, illustrative embodiments thereof, these embodiments may be modified at will within the scope of the appended claims without departing from the spirit and nature of the present disclosure.

What is claimed is:
1. A computing device, comprising:
  memory for storing:
    a predictive model generated by a neural network training engine; and a processing unit for:
executing a neural network inference engine using the predictive model for inferring a predicted number of data chunks writable on a flash memory before the flash memory wears out based on inputs, the inputs comprising a total number of physical blocks previously erased from the flash memory, a size of the data chunk and a temperature at which the flash memory is operating.

2. The computing device of claim 1, wherein the inputs further comprise one or more characteristics of the flash memory.

3. The computing device of claim 1, wherein the inputs are received by the processing unit via at least one of the following: a communication interface of the computing device, and a user interface of the computing device.

4. The computing device of claim 1, wherein the predicted number of data chunks writable on the flash memory before the flash memory wears out is displayed on a display of the computing device or transmitted to one or more remote computing entities via a communication interface of the computing device.

5. A computing device, comprising:
a memory device comprising flash memory, the flash memory comprising a plurality of physical blocks for writing data;
memory for storing:
a predictive model generated by a neural network training engine; and
a total number of physical blocks previously erased from the flash memory; and
a processing unit for:
executing a neural network inference engine using the predictive model for inferring a predicted number of data chunks writable on the flash memory before the flash memory wears out based on inputs, the inputs comprising the total number of physical blocks previously erased from the flash memory, a size of the data chunk and a temperature at which the flash memory is operating.

6. The computing device of claim 5, wherein the inputs further comprise one or more characteristics of the flash memory.

7. The computing device of claim 5, wherein the processing unit further writes the data chunk on the flash memory, determines a number of physical blocks erased from the flash memory by the writing of the data chunk on the flash memory, and updates the total number of physical blocks previously erased from the flash memory with the number of physical blocks erased from the flash memory by the writing of the data chunk on the flash memory.

8. The computing device of claim 5, wherein the processing unit takes an action for preserving a lifespan of the flash memory based at least on the predicted number of data chunks writable on the flash memory before the flash memory wears out.

9. The computing device of claim 5, wherein the memory for storing the predictive model and the total number of physical blocks previously erased from the flash memory is the flash memory.

10. The computing device of claim 5, wherein the memory for storing the predictive model and the total number of physical blocks previously erased from the flash memory is different from the flash memory.

11. A method for inferring a predicted number of data chunks writable on a flash memory before the flash memory wears out, the method comprising:
storing by a computing device a predictive model generated by a neural network training engine; and
executing by a processing unit of the computing device a neural network inference engine using the predictive model for inferring the predicted number of data chunks writable on the flash memory before the flash memory wears out based on inputs, the inputs comprising a total number of physical blocks previously erased from the flash memory, a size of the data chunk and a temperature at which the flash memory is operating.

12. The method of claim 11, wherein the inputs further comprise one or more characteristics of the flash memory.

13. The method of claim 11, wherein the inputs are received by the processing unit via at least one of the following: a communication interface of the computing device, and a user interface of the computing device.

14. The method of claim 11, further comprising: displaying the predicted number of data chunks writable on the flash memory before the flash memory wears out on a display of the computing device, or transmitting the predicted number of data chunks writable on the flash memory before the flash memory wears out to one or more remote computing entities via a communication interface of the computing device.

15. The method of claim 11, wherein the flash memory is comprised in the computing device, and the method further comprises storing by the computing device the total number of physical blocks previously erased from the flash memory.

16. The method of claim 15, further comprising: writing by the processing unit the data chunk on the flash memory, determining by the processing unit a number of physical blocks erased from the flash memory by the writing of the data chunk on the flash memory, and updating by the processing unit the total number of physical blocks previously erased from the flash memory with the number of physical blocks erased from the flash memory by the writing of the data chunk on the flash memory.

17. The method of claim 15, further comprising: taking an action for preserving a lifespan of the flash memory based at least on the predicted number of data chunks writable on the flash memory before the flash memory wears out.

* * * * *